(12) United States Patent
Lee et al.

(10) Patent No.: US 9,099,378 B2
(45) Date of Patent: Aug. 4, 2015

(54) SCHOTTKY BARRIER DIODE AND METHOD OF MANUFACTURING THE SAME

(71) Applicant: Hyundai Motor Company, Seoul (KR)

(72) Inventors: Jong Seok Lee, Suwon-si (KR); Kyoung-Kook Hong, Hwaseong-si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 0 days.

(21) Appl. No.: 13/710,119

(22) Filed: Dec. 10, 2012

(65) Prior Publication Data
US 2014/0077225 A1 Mar. 20, 2014

(30) Foreign Application Priority Data

Sep. 14, 2012 (KR) .......................... 10-2012-0101967

(51) Int. Cl.
*H01L 29/66* (2006.01)
*H01L 29/16* (2006.01)

(52) U.S. Cl.
CPC ...... *H01L 29/1608* (2013.01); *H01L 29/66068* (2013.01)

(58) Field of Classification Search
None
See application file for complete search history.

(56) References Cited

U.S. PATENT DOCUMENTS

| 4,134,123 | A | * | 1/1979 | Shannon | 257/484 |
| 2006/0255423 | A1 | * | 11/2006 | Ryu et al. | 257/485 |
| 2008/0258153 | A1 | | 10/2008 | Yamamoto et al. | |
| 2008/0296587 | A1 | | 12/2008 | Yamamoto et al. | |
| 2009/0160008 | A1 | * | 6/2009 | Fujiwara et al. | 257/471 |

FOREIGN PATENT DOCUMENTS

| JP | 06-112216 A | | 4/1994 | |
| JP | 2002-314099 A | | 10/2002 | |
| JP | 2005-229071 | * | 8/2005 | ............. H01L 29/47 |
| JP | 2005-229071 A | | 8/2005 | |

* cited by examiner

*Primary Examiner* — David Vu
*Assistant Examiner* — Cuong Nguyen
(74) *Attorney, Agent, or Firm* — Morgan, Lewis & Bockius LLP

(57) ABSTRACT

A schottky barrier diode may include a first n− type epitaxial layer disposed on a first surface of an n+ type silicon carbide substrate, a first p+ region disposed in the first n− type epitaxial layer, a second n type epitaxial layer disposed on the first n− type epitaxial layer and the first p+ region, a second p+ region disposed in the second n type epitaxial layer, a schottky electrode disposed on the second n type epitaxial layer and the second p+ region, and an ohmic electrode disposed on a second surface of the n+ type silicon carbide substrate, wherein the first p+ region and the second p+ region may be in contact with each other.

2 Claims, 7 Drawing Sheets

SCHOTTKY BARRIER DIODE AND METHOD OF MANUFACTURING THE SAME

CROSS-REFERENCE TO RELATED APPLICATION

The present application claims priority to Korean Patent Application No. 10-2012-0101967 filed on Sep. 14, 2012, the entire contents of which is incorporated herein for all purposes by this reference.

BACKGROUND OF THE INVENTION

1. Field of the Invention

The present invention relates to a schottky barrier diode including silicon carbide (SiC), and a method of manufacturing the same.

2. Description of Related Art

A schottky barrier diode (SBD) uses a schottky junction which is a junction of metal and a semiconductor without using PN junction unlike a general PN diode, exhibits a rapid switching characteristic, and has a turn-on voltage characteristic that is lower than that of the PN diode.

In a general schottky barrier diode, a structure of junction barrier schottky (JBS), in which a p+ region is formed in a lower end of a schottky junction portion in order to improve a reduction characteristic of a leak current, is applied to block the leak current and improve a breakdown voltage by overlapping PN diode depletion layers diffused when a reverse voltage is applied.

However, since the p+ region exists in the schottky junction portion, there is a problem in that a contact area of a schottky electrode and an n− drift layer, which serves to be a current path in a forward direction, is reduced to increase a resistance value, and on-resistance of the schottky barrier diode is increased. Further, since the p+ region floats, a width of the depletion layer blocking the leak current is not large, and thus there is a difficulty during a process in that an interval between the p+ regions is reduced.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to maximize a schottky junction area to reduce on-resistance when a forward direction voltage is applied in a schottky barrier diode.

In an exemplary embodiment of the present invention, a schottky barrier diode may include an n− type epitaxial layer disposed on a first surface of an n+ type silicon carbide substrate, a first p+ region disposed in the n− type epitaxial layer, an n type epitaxial layer disposed on the n− type epitaxial layer and the first p+ region, a second p+ region disposed in the n type epitaxial layer, a schottky electrode disposed on the n type epitaxial layer and the second p+ region, and an ohmic electrode disposed on a second surface of the n+ type silicon carbide substrate, wherein the first p+ region and the second p+ region are in contact with each other.

The first p+ region may be formed in a lattice shape on a surface of the n− type epitaxial layer.

The second p+ region may be formed in a quadrangle shape surrounding an edge of the n type epitaxial layer.

In another aspect of the present invention, a method of manufacturing a schottky barrier diode may include forming an n− type epitaxial layer on a first surface of an n+ type silicon carbide substrate, injecting p+ ions into a surface of the n− type epitaxial layer to form a first p+ region, forming an n type epitaxial layer on the n− type epitaxial layer and the first p+ region, injecting n+ ions into a surface of the n type epitaxial layer to form a second p+ region, forming a schottky electrode on the n type epitaxial layer and the second p+ region, and forming an ohmic electrode on a second surface of the n+ type silicon carbide substrate, wherein the first p+ region and the second p+ region are in contact with each other.

The first p+ region may be formed in a lattice shape on the surface of the n− type epitaxial layer.

The second p+ region may be formed in a quadrangle shape surrounding an edge of the n type epitaxial layer.

As described above, according to the exemplary embodiments of the present invention, it is possible to maximize a schottky junction area, thus reducing on-resistance when a forward direction voltage is applied.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
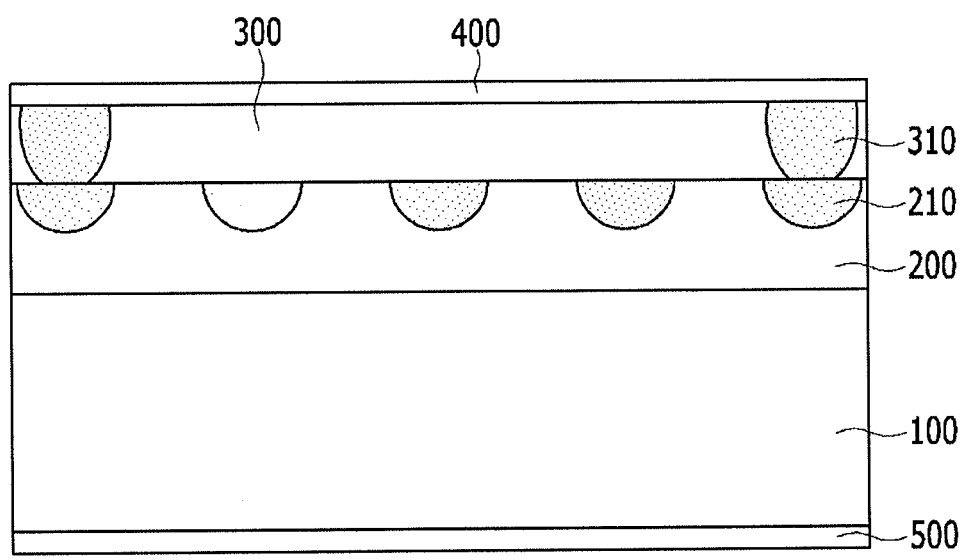
FIG. 1 is a cross-sectional view of a schottky barrier diode according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Exemplary embodiments of the present invention will be described in detail with reference to the accompanying drawings. However, the present invention is not limited to the exemplary embodiments that are described herein but may be embodied into other forms. The exemplary embodiments that are disclosed herein are provided so that the disclosed contents may become thorough and complete and the spirit of the present invention may be sufficiently understood to a person of an ordinary skill in the art.

In the drawings, the thickness of layers and regions are exaggerated for clarity. In addition, in the case when it is mentioned that a layer is present "on" the other layer or a substrate, the layer may be directly formed on the other layer or the substrate or a third layer may be interposed therebetween. Like reference numerals designate like constituent elements throughout the specification.

Figure 2:
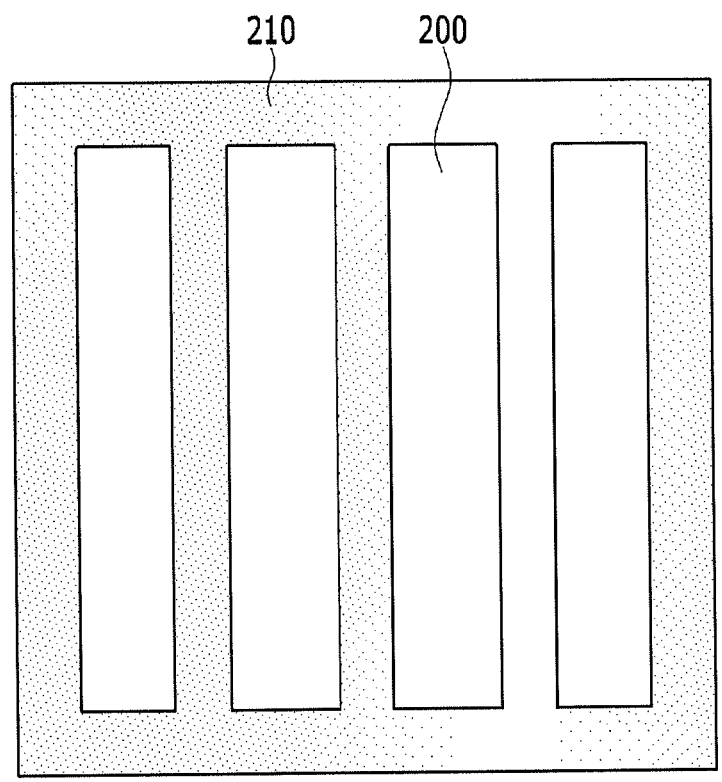
FIG. 2 is a top plan view of an n− type epitaxial layer of FIG. 1.
Figure 3:
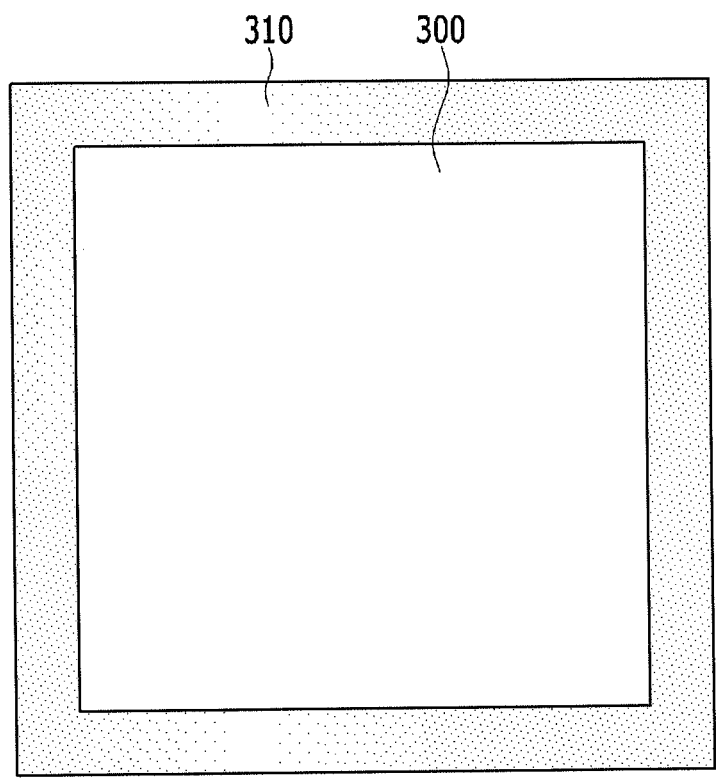
FIG. 3 is a top plan view of an n type epitaxial layer of FIG. 1.

FIG. 1 is a cross-sectional view of a schottky barrier diode according to an exemplary embodiment of the present invention, FIG. 2 is a top plan view of an n− type epitaxial layer of FIG. 1, and FIG. 3 is a top plan view of an n type epitaxial layer of FIG. 1.

Referring to FIGS. 1 to 3, in the schottky barrier diode according to the present exemplary embodiment, an n− type epitaxial layer 200, an n type epitaxial layer 300, and a schottky electrode 400 are sequentially laminated on a first surface of an n+ type silicon carbide substrate 100, and an ohmic electrode 500 is laminated on a second surface of the n+ type silicon carbide substrate 100.

A first p+ region 210 into which p+ ions are injected is formed in the n− type epitaxial layer 200, and a second p+ region 310 into which the p+ ions are injected is formed in the n type epitaxial layer 300.

The first p+ region 210 is formed in a lattice shape on a surface of the n− type epitaxial layer 200. The second p+ region 310 is formed in a quadrangle shape surrounding an edge of the n type epitaxial layer 300, and is in contact with the first p+ region 210.

As described above, since the first p+ region 210 and the second p+ region 310 are in contact with each other to be electrically connected, a reverse bias is applied to a junction region of the first p+ region 210 and the n− type epitaxial layer 200 when the reverse bias is applied, and thus a depletion layer that is wider than a known matter is formed to largely reduce a leak current.

Further, the first p+ region 210 may be formed on the surface of the n− type epitaxial layer 200, and the second p+ region 310 that is in contact with the first p+ region 210 may be formed at an edge of the n type epitaxial layer 300 to increase a schottky junction area, thus reducing on-resistance when the forward direction voltage is applied.

Then, referring to FIGS. 4 to 7 and FIG. 1, a method of manufacturing the semiconductor device according to the exemplary embodiment of the present invention will be described in detail.

FIGS. 4 to 7 are views sequentially illustrating a method of manufacturing the schottky barrier diode according to the exemplary embodiment of the present invention.

Figure 4:
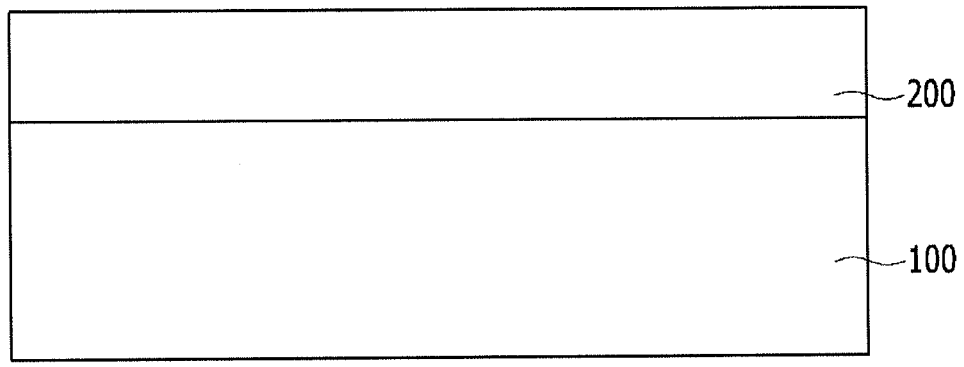
FIGS. 4 to 7 are views sequentially illustrating a method of manufacturing the schottky barrier diode according to the exemplary embodiment of the present invention.

As illustrated in FIG. 4, the n+ type silicon carbide substrate 100 is prepared, and the n− type epitaxial layer 200 is formed on a first surface of the n+ type silicon carbide substrate 100 by an epitaxial growth.

Figure 5:
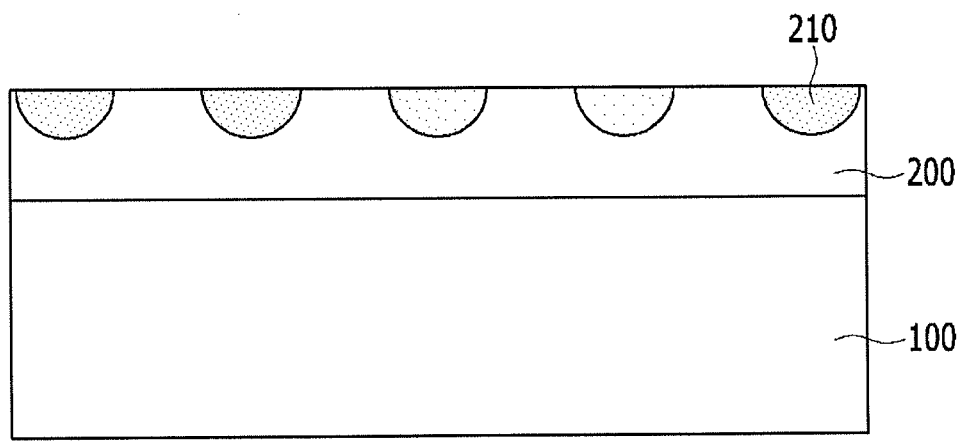

Subsequently, as illustrated in FIG. 5, the first p+ region 210 is formed by injecting p+ ions into a portion of the surface of the n− type epitaxial layer 200. The first p+ region 210 is formed in a lattice shape on the surface of the n− type epitaxial layer 200.

Figure 6:
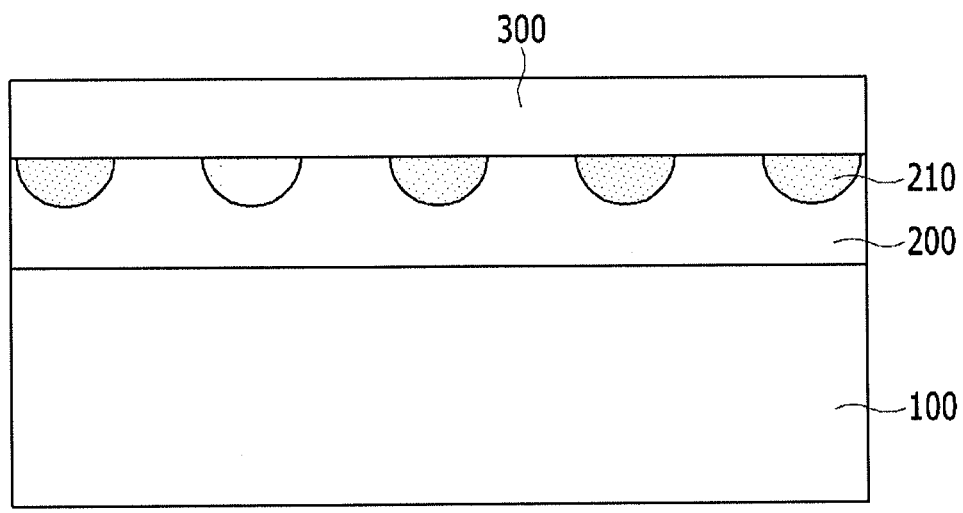

Subsequently, as illustrated in FIG. 6, the n type epitaxial layer 300 is formed on the n− type epitaxial layer 200 and the first p+ region 210 by the epitaxial growth.

Figure 7:
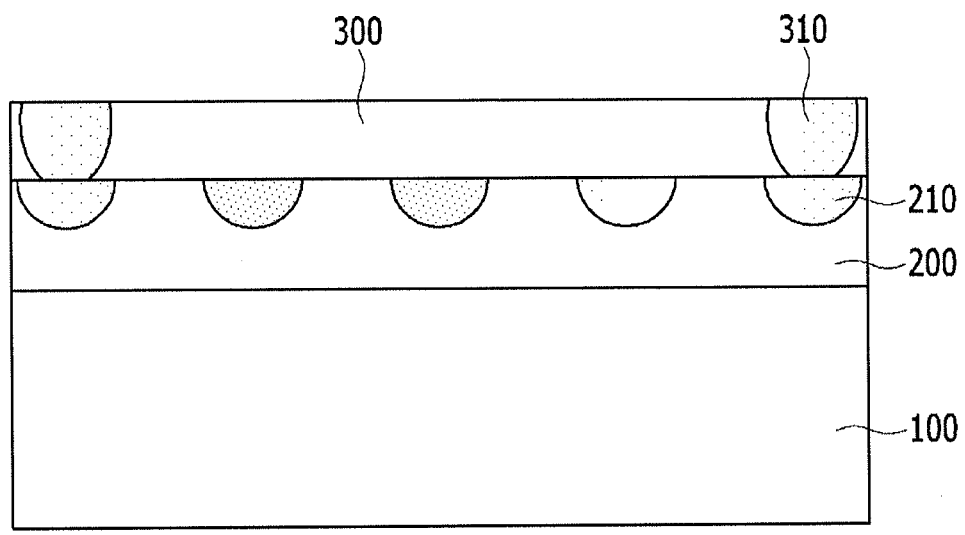

Subsequently, as illustrated in FIG. 7, the second p+ region 310 is formed by injecting p+ ions into a portion of the surface of the n type epitaxial layer 300. The second p+ region 310 is formed in a quadrangle shape surrounding the edge of the n type epitaxial layer 300. The second p+region 310 is in contact with the first p+ region 210.

Subsequently, as illustrated in FIG. 1, a schottky electrode 400 is formed on the n type epitaxial layer 300 and the second p+ region 310, and an ohmic electrode 500 is formed on the second surface of the n+ type silicon carbide substrate 100.

For convenience in explanation and accurate definition in the appended claims, the terms "upper", "lower", "inner" and "outer" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A schottky barrier diode comprising:
   an n− type epitaxial layer disposed on a first surface of an n+ type silicon carbide substrate;
   a first p+ region disposed in the n− type epitaxial layer;
   an n type epitaxial layer disposed on the n− type epitaxial layer and the first p+ region;
   a second p+ region disposed in the n type epitaxial layer and formed in a quadrangle shape;
   a schottky electrode disposed on and contacting the n type epitaxial layer and the second p+ region; and
   an ohmic electrode disposed on a second surface of the n+ type silicon carbide substrate,
   wherein the first p+ region comprises a first portion formed in a quadrangle shape and a second portion disposed on the first portion and connected to the first portion,
   wherein the second p+ region is directly placed on the first portion of the first p+ region, such that the first portion of the first p+ region and the second p+ region are in contact with each other,
   wherein the second portion of the first p+ region is connected to the second p+ region through the first portion of the first p+ region,
   wherein the n type epitaxial layer comprises a middle portion and an outer edge portion surrounding the middle portion; and
   wherein the second p+ region is disposed on the outer edge portion of the n type epitaxial layer and is not disposed in the middle portion of the n type epitaxial layer.

2. The schottky barrier diode of the claim 1, wherein the schottky electrode is disposed on and fully contacts the n type epitaxial layer and the second p+ region.

* * * * *